United States Patent
Lulla et al.

(10) Patent No.: US 6,922,820 B1
(45) Date of Patent: Jul. 26, 2005

(54) CIRCUIT FOR GENERATING SILICON ID FOR PLDS

(75) Inventors: Navaz Lulla, Fremont, CA (US); Anup Nayak, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 96 days.

(21) Appl. No.: 09/689,532

(22) Filed: Oct. 12, 2000

(51) Int. Cl.[7] ............................................. G06F 17/50
(52) U.S. Cl. ............................................ 716/4; 714/733
(58) Field of Search ......................... 716/4, 1; 714/733

(56) References Cited

U.S. PATENT DOCUMENTS

| | | | | |
|---|---|---|---|---|
| 4,855,669 A | * | 8/1989 | Mahoney | 324/73.1 |
| 4,876,671 A | * | 10/1989 | Norwood et al. | 365/185.08 |
| 5,467,304 A | * | 11/1995 | Uchida et al. | 365/174 |
| 5,557,236 A | * | 9/1996 | Monti | 327/564 |
| 5,570,042 A | * | 10/1996 | Ma | 326/63 |
| 5,796,267 A | * | 8/1998 | Pedersen | 326/37 |
| 6,066,890 A | * | 5/2000 | Tsui et al. | 257/723 |
| 6,157,213 A | * | 12/2000 | Voogel | 326/41 |
| 6,308,311 B1 | * | 10/2001 | Carmichael et al. | 716/16 |
| 6,311,246 B1 | * | 10/2001 | Wegner et al. | 710/306 |
| 6,411,549 B1 | * | 6/2002 | Pathak et al. | 365/185.2 |
| 6,466,053 B2 | * | 10/2002 | Duesman | 326/47 |
| 6,525,560 B1 | * | 2/2003 | Trimberger et al. | 326/38 |

OTHER PUBLICATIONS

"IEEE Standard Test Access Port and Boundary–Scan Architecture, IEEE Std 1149.1–1990". p. 1–127.*
"Supplement to IEEE Std 1149.1–1990, IEEE Standard Test Access Port and Boundary–Scan Architecture". p. 1–68.*
IBM TDB Publication, "Using a portion of the boundary register as the identification register", Sep. 1989, IBM vol. 32–4a. pp. 262–264.*
"IEEE Standard Test Access Port and Boundary–Scan Architecture", IEEE Std 1149.1–1990, pp. 1–127.
"Supplement to IEEE Std 1149.1–1990, IEEE Standard Test Access Port and Boundary–Scan Architecture", IEEE Std 1149.1b–1994, pp. 1–68.
Zhiwu Liu, "Soft Coding of Multiple Device IDS for IEEE Compliant JTAG Devices", U.S. Appl. No. 09/589,919, filed Jun. 7, 2000.

* cited by examiner

Primary Examiner—Stacy A. Whitmore
(74) Attorney, Agent, or Firm—Christopher P. Maiorana, PC (57) ABSTRACT

An apparatus comprising a circuit configured to select one of a number of identification (ID) codes in response to a voltage level at one or more pins.

26 Claims, 4 Drawing Sheets

CIRCUIT FOR GENERATING SILICON ID FOR PLDS

FIELD OF THE INVENTION

The present invention relates to a method and/or architecture for generating a silicon ID generally and, more particularly, to a method and/or architecture for generating a silicon ID in a programmable logic device (PLD).

BACKGROUND OF THE INVENTION

Implementing JTAG compliant devices on integrated circuits (ICs) is an industry trend. The Institute of Electrical and Electronics Engineers, Inc. (IEEE) publishes a variety of specifications, such as the IEEE 1149.1 standard, published in 1999, which is hereby incorporated by reference in its entirety. An IEEE 1149.1 compliant device has an identification (ID) code register. The identification code register is a 32-bit register that allows the manufacturer, part number, and version of a device to be determined using the JTAG protocol. The IEEE standard 1149.1 permits implementation of a unique ID code for devices differing from each other only in packages or metal options.

Figure 1:
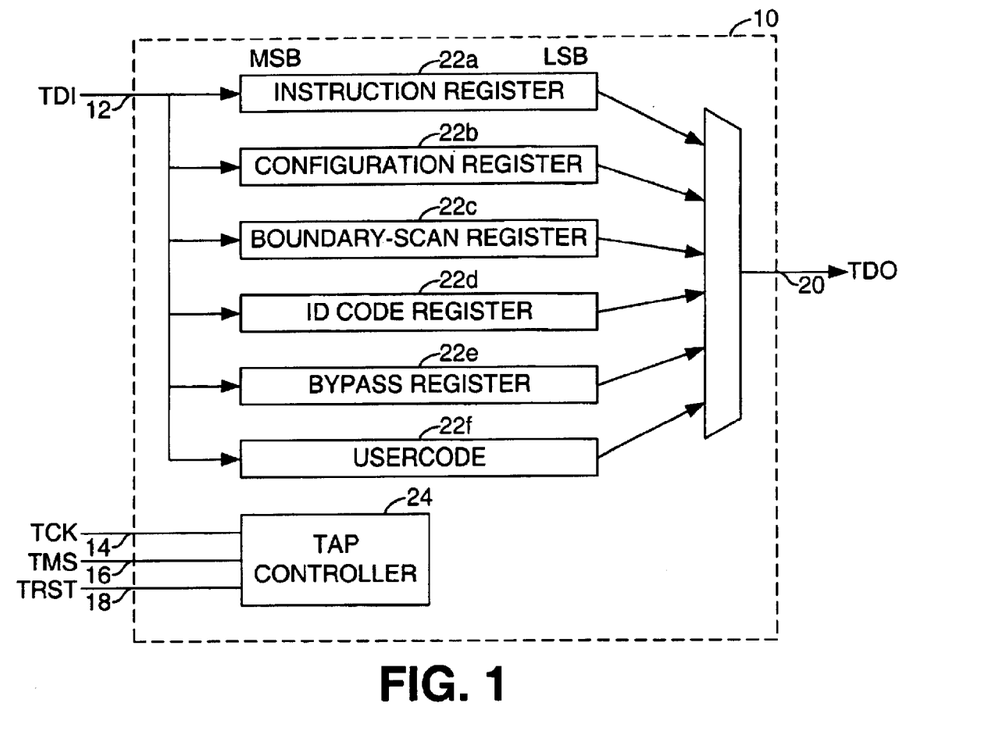
FIG. 1 is a block diagram illustrating a JTAG Test Access Port.

Referring to FIG. 1, a block diagram of a JTAG test access port (TAP) 10 is shown. The test access port 10 has an input 12 that receives a test data input (TDI), an input 14 that receives a test clock signal (TCK), an input 16 that receives a test mode select signal (TMS), an input 18 that receives a test reset signal (TRST), and an output 20 that presents a test data output signal (TDO). The test access port 10 can have a number of registers 22a–22f and a TAP controller 24. The registers 22a–22f can receive the signal TDI and present the signal TDO. The TAP controller 24 controls the sequence of operations of the test access port 10 in response to the signals TCK, TMS and TRST.

The register 22d is a 32-bit ID code register. The ID code register can contain 32 bits that identify that part number, version, and manufacturer's identity for the device containing the test access port 10.

Figure 2:
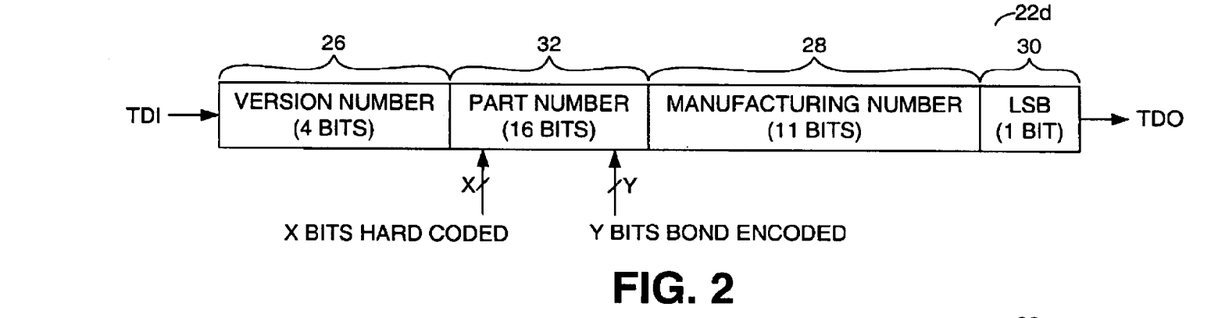
FIG. 2 is a detailed block diagram illustrating an ID Code register of the test access port of FIG. 1.

Referring to FIG. 2, a more detailed block diagram of the register 22d of FIG. 1 is shown. The ID code register 22d has a portion 26, a portion 28, a portion 30, and a portion 32. The portion 26 contains 4 bits identifying the version number of silicon die of the IEEE 1149.1 compliant device. The portion 28 contains 11 bits that identify the manufacturer of the die using a compact form of the JEDEC identification code. The portion 30 contains a single bit (i.e., the least significant bit of the ID code register 22d). The portion 30 is always set to a binary 1. The portion 30 indicates the presence of the ID code register in a IEEE 1149.1 compliant device. The portion 32 contains 16 bits that represent a unique part number for the device. In a conventional device, the portions 26–30 are hard coded and the portion 32 consists of a combination of hard coded bits and bond encoded bits.

The use of hard coded bits and bond encoded bits can produce a unique identification code for devices differing from each other only in packages or metal options. The device ID cannot be changed after fabrication is complete.

When a single combination of die and package can be sold as separate IEEE 1149.1 compliant parts, multiple device IDs are required. The use of hard coded and bond option encoded ID bit does not allow a single combination of die and package to have multiple ID codes.

SUMMARY OF THE INVENTION

The present invention concerns an apparatus comprising a circuit configured to select one of a number of identification (ID) codes in response to a voltage level at each of a number of pins.

The objects, features and advantages of the present invention include providing a method and/or architecture for generating a silicon ID in a programmable logic device (PLD) that may (i) provide flexibility of marking and marketing the same die on the same package as several different devices, (ii) provide multiple device IDs for a single combination of die and package that may be sold as separate IEEE 1149.1 compliant parts, and/or (iii) allow changing a device ID by changing package markings.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
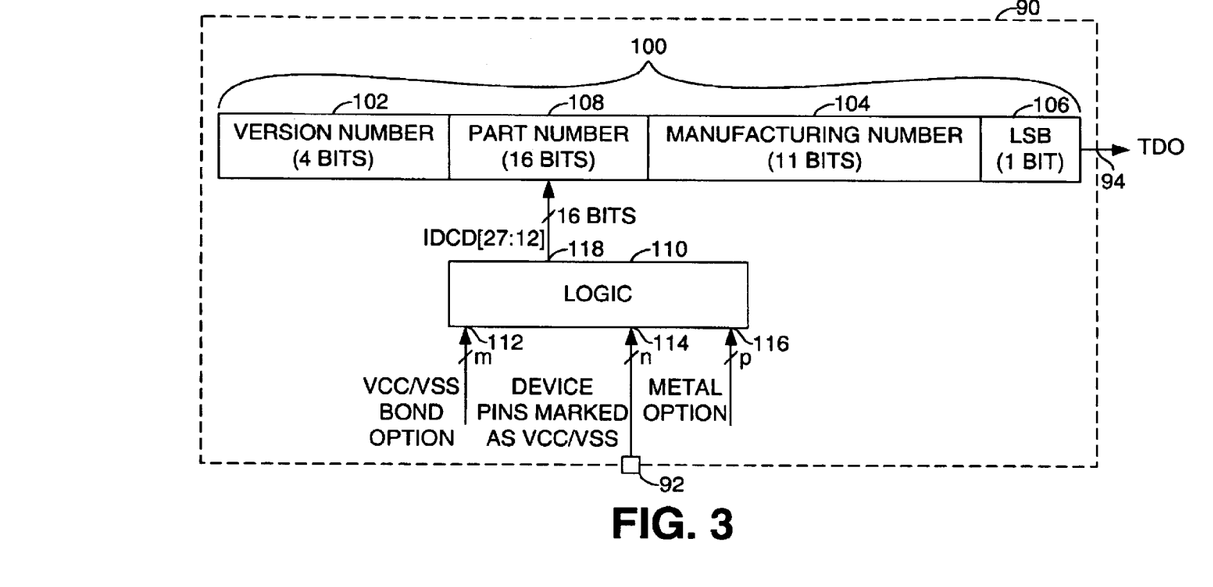
FIG. 3 is a block diagram illustrating a preferred embodiment of the present invention.

Referring to FIG. 3, a block diagram of a device 90 implemented in accordance with a preferred embodiment of the present invention is shown. The device 90 may be an IEEE 1149.1 compliant device. The device 90 may have a number of input pins 92 that may be designated, in one example, as voltage supply pins and/or voltage supply ground pins. The device 90 may have an output 94 that may present a signal (e.g., TDO). The signal TDO may be a test data output signal in accordance with the IEEE 1149.1-1990 standard (JTAG). The signal TDO may comprise an identification (ID) code (e.g., IDCD) for the device 90 in response to a JTAG identification request. The identification code IDCD may be, in one example, a 32 bit JTAG ID code (e.g., IDCD<31:0>). The identification code may identify, in one example, a version number, a part number, and a manufacturer number for the device 90. However, the identification code may be implemented with any number of bits or identification information necessary to meet the design criteria of a particular application.

In one example, the identification code presented in the signal TDO may be one of a number of identification codes programmed into the device 90 using hard coded bits (e.g., metal options), bond encoded bits, or any other appropriate programming means (e.g., look-up table, ROM, EPROM, etc.). The identification code presented in the signal TDO may be selected from the number of programmed identification codes in response to voltage levels presented to the pins 92. In one example, the voltage levels presented to the pins 92 may be encoded in the identification code.

The device 90 may comprise a register 100. In one example, the register 100 may be an identification code register of a JTAG compliant IC. The register 100 may comprise a portion 102, a portion 104, a portion 106, and a portion 108. The portion 102 may comprise, in one example, 4 bits (e.g., IDCD<31:28>) that may be encoded to indicate a version number for the IC. The portion 104 may comprise, in one example, 11 bits (e.g., IDCD<11:1>) that may be encoded to indicate a manufacturing number. The portion 106 may comprise, in one example, a single bit (e.g., IDCD<0>) that may be set to a binary 1 to indicate the presence of the register 100 in a particular IC. The portion 108 may comprise, in one example, 16 bits (e.g., IDCD<27:12>) that may be encoded to indicate a part number of the IC. However, the number of bits in each of the portions 102–108 may be varied to meet the design criteria of a particular application.

In one example, the portions 102–106 may be hard coded and the portion 108 may be provided by a logic circuit 110. The circuit 110 may have an input 112 that may receive one or more signals from one or more bond options, an input 114 that may receive one or more signals from one or more pins, an input 116 that may receive one or more signals from one or more metal options, and an output 118 that may present the portion 108 of the register 110. The total number of bond options, metal options, and pins may be greater than the number of bits of the register 100 presented by the circuit 110. The circuit 110 may be configured, in one example, to generate a 16-bit part number in response to a logical combination of the inputs 112, 114 and 116. In one example, a bond option connected to the input 112 may be connected to either a voltage supply (e.g., VCC) or a voltage supply ground (e.g., VSS). The pins connected to the input 114 may likewise be connected to either the voltage supply VCC or the voltage supply ground VSS. Depending on the part number desired for a particular device the pins may be labeled as either VCC, VSS, or any other appropriate label.

Figure 4:
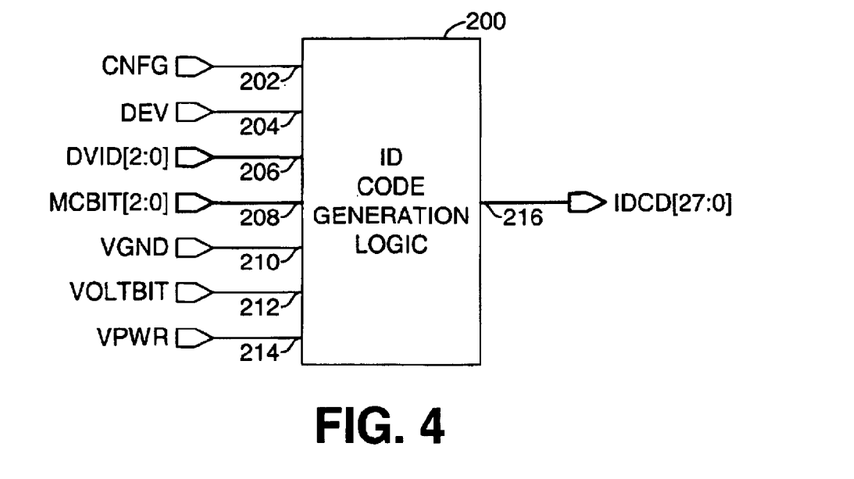
FIG. 4 is a block diagram illustrating an alternative embodiment of the present invention.

Referring to FIG. 4, a block diagram of a circuit 200 is shown illustrating an alternative embodiment of the present invention. The circuit 200 may be configured to generate, in one example, 28 bits of the ID code contained in the ID code register 100 (e.g., IDCD<27:0>). However, the circuit 200 may be configured to generate any portion of the ID code to meet the design criteria of a particular application. The circuit 200 may have an input 202 that may receive a signal (e.g., CNFG), an input 204 that may receive a signal (e.g., DEV), an input 206 that may receive a signal (e.g., DVID), an input 208 that may receive a signal (e.g., MCBIT), an input 210 that may receive a signal (e.g., VGND), an input 212 that may receive a signal (e.g., VOLTBIT), an input 214 that may receive a signal (e.g., VPWR), and an output 216 that may present the ID code to the register 100.

Each of the signals CNFG and DEV may be implemented as a single bit that may be generated in response to a voltage level presented to a pin. For example, the signal CNFG may have a first state (e.g., 0) that indicates a non-volatile version of a device and a second state (e.g., 1) that indicates a volatile version of the device. The signal DEV may have a first state (e.g., 0) that may indicate a first category of part (e.g., high density) and a second state (e.g., 1) that may indicate a second category of part (e.g., low priced). However, the signals CNFG and DEV may be implemented with any number of bits necessary to meet the design criteria of a particular application.

The signal DVID may be implemented as a number of bits that may indicate a package style. For example, the following Table 1 illustrates an example where the signal DVID is implemented with 3 bits:

TABLE 1

| Package | DVID<2:0> |
|---------|-----------|
| PQFP 208 | 000 |
| FBGA 256 | 010 |
| BGA 352 | 011 |
| FBGA 484 | 100 |
| FGBA 676 | 110 |

However, other number of bits and packages may be implemented accordingly to meet the design criteria of a particular application.

The signal MCBIT may be implemented as a number of bits that may indicate a device characteristic (e.g., a number of macro cells in the device, etc.). For example, the following Table 2 illustrates an example where the signal MCBIT is implemented with 3 bits that may be encoded to indicate a number of macrocells of the device:

TABLE 2

| Device | MCBIT<2:0> |
|--------|------------|
| 768 | 000 |
| 1152 | 001 |
| 1536 | 010 |
| 2048 | 011 |
| 2560 | 100 |
| 3200 | 101 |

However, other encoding schemes and/or characteristics may implemented accordingly to meet the design criteria of a particular application.

The signal VOLTBIT may be implemented, in one example, as a single bit. The signal VOLTBIT may be used to indicate an operating voltage of a particular device. For example, the signal VOLTBIT may have a first state (e.g., 0) that may indicate an operating voltage of 1.8V and a second state that may indicate an operating voltage of 3.3V. The signal VOLTBIT may be implemented (i) using other numbers of bits and/or (ii) to indicate other operating voltages as may be necessary to meet the design criteria of a particular application.

In one example, the four most significant bits IDCD<31:28> may be hard coded (as described in connection with FIG. 6). The eight most significant bits of the ID code generated by the circuit 200 (e.g., IDCD<27:20>) may be similarly hard coded, The remaining 8 bits of the ID code generating by the circuit 200 (e.g., IDCD<19:12>) may be generated in response to a logical combination of the 9 bits comprising the signals DVID, VOLTBIT, MCBIT, CNFG, and DEV. However, other numbers of bits may be used to meet the design criteria of a particular application.

The logic of the circuit 200 may be implemented using a software design tool such as the VERILOG hardware description language (HDL) as defined by the IEEE 1364-1995 Standard. The following is an example of Verilog source code that may be used to implement the circuit 200.

Module c39ccb_idcode (idcd, dev, cnfg, dvid, voltbit, mcbit, vpwr, vgnd);
output [27:0] idcd;
input dev, cnfg, voltbit;
input [2:0] dvid;
input [2:0] mcbit;
input vpwr;

```
input vgnd;
wire [8:0] tmp;
reg [7:0] idcd_tmp;
/* this concatenates the manufacturing code, the idcd_tmp and the most
significant 8 bits which are zero for this device */
wire [27:0] idcd = {8'b00000000, idcd_tmp, 11'b00000110100, 1'b1};
//Cypress's manufacturing code is 34hex
/* mcbit
000 unused cannot be used in the future
001 768
010 1536
011 spare , codes are provided for future use
100 2560
101 3200
110 256
111 512
Voltbit
0 1.8
Packages (devid)
000 208 PQFP
010 256 FBGA
011 352 BGA
100 484 FBGA
110 FBA 676
111 spare
cnfg
0 NV
1 Volatile
Dev
0 39K
1 38K
*/
assign tmp = { mcbit, dvid, cnfg, dev, voltbit};
/* Don't have a 38K NV*/
Always@(tmp)
  begin
    case (tmp) // synopsys parallel-case full-case
*/768
        9'b001000000: idcd_tmp = 8'b00000000;
        9'b001000001: idcd_tmp = 8'b00000001;
        9'b001000100: idcd_tmp = 8'b00000010;
        9'b001000101: idcd_tmp = 8'b00000011;
        9'b001000110: idcd_tmp = 8'b00000100;
        9'b001000111: idcd_tmp = 8'b00000101;
        9'b001010000: idcd_tmp = 8'b00000110;
        9'b001010001: idcd_tmp = 8'b00000111;
        9'b001010100: idcd_tmp = 8'b00010000;
        9'b001010101: idcd_tmp = 8'b00001001;
        9'b001010110: idcd_tmp = 8'b00001010;
        9'b001010111: idcd_tmp = 8'b00001011;
        9'b001011000: idcd_tmp = 8'b00001100;
        9'b001011001: idcd_tmp = 8'b00001101;
        9'b001011100: idcd_tmp = 8'b00001110;
        9'b001011101: idcd_tmp = 8'b00001111;
        9'b001011110: idcd_tmp = 8'b00010000;
        9'b001011111: idcd_tmp = 8'b00010001;
        9'b001100000: idcd_tmp = 8'b00010010;
        9'b001100001: idcd_tmp = 8'b00010011;
        9'b001100100: idcd_tmp = 8'b00010100;
        9'b001100101: idcd_tmp = 8'b00010101;
        9'b001100110: idcd_tmp = 8'b00010110;
        9'b001100111: idcd_tmp = 8'b00010111;
        9'b001110000: idcd_tmp = 8'b00011000;
        9'b001110001: idcd_tmp = 8'b00011001;
        9'b001110100: idcd_tmp = 8'b00011010;
        9'b001110101: idcd_tmp = 8'b00011011;
        9'b001110110: idcd_tmp = 8'b00011100;
        9'b001110111: idcd_tmp = 8'b00011101;
        9'b001111000: idcd_tmp = 8'b00011110;
        9'b001111001: idcd_tmp = 8'b00011111;
        9'b001111100: idcd_tmp = 8'b00100000;
        9'b001111101: idcd_tmp = 8'b00100001;
        9'b001111110: idcd_tmp = 8'b00100010;
        9'b001111111: idcd_tmp = 8'b00100011;
//1536
        9'b010000000: idcd_tmp = 8'b00100100;
        9'b010000001: idcd_tmp = 8'b00100101;
        9'b010000100: idcd_tmp = 8'b00100110;
        9'b010000101: idcd_tmp = 8'b00100111;
        9'b010000110: idcd_tmp = 8'b00101000;
        9'b010000111: idcd_tmp = 8'b00101001;
        9'b010010000: idcd_tmp = 8'b00101010;
        9'b010010001: idcd_tmp = 8'b00101011;
        9'b010010100: idcd_tmp = 8'b00101100;
        9'b010010101: idcd_tmp = 8'b00101101;
        9'b010010110: idcd_tmp = 8'b00101110;
        9'b010010111: idcd_tmp = 8'b00101111;
        9'b010011000: idcd_tmp = 8'b00110000;
        9'b010011001: idcd_tmp = 8'b00110001;
        9'b010011100: idcd_tmp = 8'b00110010;
        9'b010011101: idcd_tmp = 8'b00110011;
        9'b010011110: idcd_tmp = 8'b00110100;
        9'b010011111: idcd_tmp = 8'b00110101;
        9'b010100000: idcd_tmp = 8'b00110110;
        9'b010100001: idcd_tmp = 8'b00110111;
        9'b010100100: idcd_tmp = 8'b00111000;
        9'b010100101: idcd_tmp = 8'b00111001;
        9'b010100110: idcd_tmp = 8'b00111010;
        9'b010100111: idcd_tmp = 8'b00111011;
        9'b010110000: idcd_tmp = 8'b00111100;
        9'b010110001: idcd_tmp = 8'b00111101;
        9'b010110100: idcd_tmp = 8'b00111110;
        9'b010110101: idcd_tmp = 8'b00111111;
        9'b010110110: idcd_tmp = 8'b01000000;
        9'b010110111: idcd_tmp = 8'b01000001;
        9'b010111000: idcd_tmp = 8'b01000010;
        9'b010111001: idcd_tmp = 8'b01000011;
        9'b010111100: idcd_tmp = 8'b01000100;
        9'b010111101: idcd_tmp = 8'b01000101;
        9'b010111110: idcd_tmp = 8'b01000110;
        9'b010111111: idcd_tmp = 8'b01000111;
//spare
        9'b011000000: idcd_tmp = 8'b01001000;
        9'b011000001: idcd_tmp = 8'b01001001;
        9'b011000100: idcd_tmp = 8'b01001010;
        9'b011000101: idcd_tmp = 8'b01001011;
        9'b011000110: idcd_tmp = 8'b01001100;
        9'b011000111: idcd_tmp = 8'b01001101;
        9'b011010000: idcd_tmp = 8'b01001110;
        9'b011010001: idcd_tmp = 8'b01001111;
        9'b011010100: idcd_tmp = 8'b01010000;
        9'b011010101: idcd_tmp = 8'b01010001;
        9'b011010110: idcd_tmp = 8'b01010010;
        9'b011010111: idcd_tmp = 8'b01010011;
        9'b011011000: idcd_tmp = 8'b01010100;
        9'b011011001: idcd_tmp = 8'b01010101;
        9'b011011100: idcd_tmp = 8'b01010110;
        9'b011011101: idcd_tmp = 8'b01010111;
        9'b011011110: idcd_tmp = 8'b01011000;
        9'b011011111: idcd_tmp = 8'b01011001;
        9'b011100000: idcd_tmp = 8'b01011010;
        9'b011100001: idcd_tmp = 8'b01011011;
        9'b011100100: idcd_tmp = 8'b01011100;
        9'b011100101: idcd_tmp = 8'b01011101;
        9'b011100110: idcd_tmp = 8'b01011110;
        9'b011100111: idcd_tmp = 8'b01011111;
        9'b011110000: idcd_tmp = 8'b01100000;
        9'b011110001: idcd_tmp = 8'b01100001;
        9'b011110100: idcd_tmp = 8'b01100010;
        9'b011110101: idcd_tmp = 8'b01100011;
        9'b011110110: idcd_tmp = 8'b01100100;
        9'b011110111: idcd_tmp = 8'b01100101;
        9'b011111000: idcd_tmp = 8'b01100110;
        9'b011111001: idcd_tmp = 8'b01100111;
        9'b011111100: idcd_tmp = 8'b01101000;
        9'b011111101: idcd_tmp = 8'b01101001;
        9'b011111110: idcd_tmp = 8'b01101010;
        9'b011111111: idcd_tmp = 8'b01101011;
//2560
        9'b100000000: idcd_tmp = 8'b01101100;
        9'b100000001: idcd_tmp = 8'b01101101;
        9'b100000100: idcd_tmp = 8'b01101110;
        9'b100000101: idcd_tmp = 8'b01101111;
        9'b100000110: idcd_tmp = 8'b01110000;
        9'b100000111: idcd_tmp = 8'b01110001;
        9'b100010000: idcd_tmp = 8'b01110010;
        9'b100010001: idcd_tmp = 8'b01110011;
        9'b100010100: idcd_tmp = 8'b01110100;
```

-continued

```
        9'b100010101: idcd_tmp = 8'b01110101;
        9'b100010110: idcd_tmp = 8'b01110110;
        9'b100010111: idcd_tmp = 8'b01110111;
        9'b100011000: idcd_tmp = 8'b01111000;
        9'b100011001: idcd_tmp = 8'b01111001;
        9'b100011100: idcd_tmp = 8'b01111010;
        9'b100011101: idcd_tmp = 8'b01111011;
        9'b100011110: idcd_tmp = 8'b01111100;
        9'b100011111: idcd_tmp = 8'b01111101;
        9'b100100000: idcd_tmp = 8'b01111110;
        9'b100100001: idcd_tmp = 8'b01111111;
        9'b100100100: idcd_tmp = 8'b10000000;
        9'b100100101: idcd_tmp = 8'b10000001;
        9'b100100110: idcd_tmp = 8'b10000010;
        9'b100100111: idcd_tmp = 8'b10000011;
        9'b100110000: idcd_tmp = 8'b10000100;
        9'b100110001: idcd_tmp = 8'b10000101;
        9'b100110100: idcd_tmp = 8'b10000110;
        9'b100110101: idcd_tmp = 8'b10000111;
        9'b100110110: idcd_tmp = 8'b10001000;
        9'b100110111: idcd_tmp = 8'b10001001;
        9'b100111000: idcd_tmp = 8'b10001010;
        9'b100111001: idcd_tmp = 8'b10001011;
        9'b100111100: idcd_tmp = 8'b10001100;
        9'b100111101: idcd_tmp = 8'b10001101;
        9'b100111110: idcd_tmp = 8'b10001110;
        9'b100111111: idcd_tmp = 8'b10001111;
//3200
        9'b101000000: idcd_tmp = 8'b10010000;
        9'b101000001: idcd_tmp = 8'b10010001;
        9'b101000100: idcd_tmp = 8'b10010010;
        9'b101000101: idcd_tmp = 8'b10010011;
        9'b101000110: idcd_tmp = 8'b10010100;
        9'b101000111: idcd_tmp = 8'b10010101;
        9'b101010000: idcd_tmp = 8'b10010110;
        9'b101010001: idcd_tmp = 8'b10010111;
        9'b101010100: idcd_tmp = 8'b10011000;
        9'b101010101: idcd_tmp = 8'b10011001;
        9'b101010110: idcd_tmp = 8'b10011010;
        9'b101010100: idcd_tmp = 8'b10011011;
        9'b101011000: idcd_tmp = 8'b10011100;
        9'b101011001: idcd_tmp = 8'b10011101;
        9'b101011100: idcd_tmp = 8'b10011110;
        9'b101011101: idcd_tmp = 8'b10011111;
        9'b101011110: idcd_tmp = 8'b10100000;
        9'b101011111: idcd_tmp = 8'b10100001;
        9'b101100000: idcd_tmp = 8'b10100010;
        9'b101100001: idcd_tmp = 8'b10100011;
        9'b101100100: idcd_tmp = 8'b10100100;
        9'b101100101: idcd_tmp = 8'b10100101;
        9'b101100110: idcd_tmp = 8'b10100110;
        9'b101100111: idcd_tmp = 8'b10100111;
        9'b101110000: idcd_tmp = 8'b10101000;
        9'b101110001: idcd_tmp = 8'b10101001;
        9'b101110100: idcd_tmp = 8'b10101010;
        9'b101110101: idcd_tmp = 8'b10101011;
        9'b101110110: idcd_tmp = 8'b10101100;
        9'b101110111: idcd_tmp = 8'b10101101;
        9'b101111000: idcd_tmp = 8'b10101110;
        9'b101111001: idcd_tmp = 8'b10101111;
        9'b101111100: idcd_tmp = 8'b10110000;
        9'b101111101: idcd_tmp = 8'b10110001;
        9'b101111110: idcd_tmp = 8'b10110010;
        9'b101111111: idcd_tmp = 8'b10110011;
//256
        9'b110000000: idcd_tmp = 8'b10110100;
        9'b110000001: idcd_tmp = 8'b10110101;
        9'b110000100: idcd_tmp = 8'b10110110;
        9'b110000101: idcd_tmp = 8'b10110111;
        9'b110000110: idcd_tmp = 8'b10111000;
        9'b110000111: idcd_tmp = 8'b10111001;
        9'b110010000: idcd_tmp = 8'b10111010;
        9'b110010001: idcd_tmp = 8'b10111011;
        9'b110010100: idcd_tmp = 8'b10111100;
        9'b110010101: idcd_tmp = 8'b10111101;
        9'b110010110: idcd_tmp = 8'b10111110;
        9'b110010111: idcd_tmp = 8'b10111111;
        9'b110011000: idcd_tmp = 8'b11000000;
        9'b110011001: idcd_tmp = 8'b11000001;
        9'b110011100: idcd_tmp = 8'b11000010;
        9'b110011101: idcd_tmp = 8'b11000011;
        9'b110011110: idcd_tmp = 8'b11000100;
        9'b110011111: idcd_tmp = 8'b11000101;
        9'b110100000: idcd_tmp = 8'b11000110;
        9'b110100001: idcd_tmp = 8'b11000111;
        9'b110100100: idcd_tmp = 8'b11001000;
        9'b110100101: idcd_tmp = 8'b11001001;
        9'b110100110: idcd_tmp = 8'b11001010;
        9'b110100111: idcd_tmp = 8'b11001011;
        9'b110110000: idcd_tmp = 8'b11001100;
        9'b110110001: idcd_tmp = 8'b11001101;
        9'b110110100: idcd_tmp = 8'b11001110;
        9'b110110101: idcd_tmp = 8'b11001111;
        9'b110110110: idcd_tmp = 8'b11010000;
        9'b110110111: idcd_tmp = 8'b11010001;
        9'b110111000: idcd_tmp = 8'b11010010;
        9'b110111001: idcd_tmp = 8'b11010011;
        9'b110111100: idcd_tmp = 8'b11010100;
        9'b110111101: idcd_tmp = 8'b11010101;
        9'b110111110: idcd_tmp = 8'b11010110;
        9'b110111111: idcd_tmp = 8'b11010111;
//512
        9'b111000000: idcd_tmp = 8'b11011000;
        9'b111000001: idcd_tmp = 8'b11011001;
        9'b111000100: idcd_tmp = 8'b11011010;
        9'b111000101: idcd_tmp = 8'b11011011;
        9'b111000110: idcd_tmp = 8'b11011100;
        9'b111000111: idcd_tmp = 8'b11011101;
        9'b111010000: idcd_tmp = 8'b11011110;
        9'b111010001: idcd_tmp = 8'b11011111;
        9'b111010100: idcd_tmp = 8'b11100000;
        9'b111010101: idcd_tmp = 8'b11100001;
        9'b111010110: idcd_tmp = 8'b11100010;
        9'b111010111: idcd_tmp = 8'b11100011;
        9'b111011000: idcd_tmp = 8'b11100100;
        9'b111011001: idcd_tmp = 8'b11100101;
        9'b111011100: idcd_tmp = 8'b11100110;
        9'b111011101: idcd_tmp = 8'b11100111;
        9'b111011110: idcd_tmp = 8'b11101000;
        9'b111011111: idcd_tmp = 8'b11101001;
        9'b111100000: idcd_tmp = 8'b11101010;
        9'b111100001: idcd_tmp = 8'b11101011;
        9'b111100100: idcd_tmp = 8'b11101100;
        9'b111100101: idcd_tmp = 8'b11101101;
        9'b111100110: idcd_tmp = 8'b11101110;
        9'b111100111: idcd_tmp = 8'b11101111;
        9'b111110000: idcd_tmp = 8'b11110000;
        9'b111110001: idcd_tmp = 8'b11110001;
        9'b111110100: idcd_tmp = 8'b11110010;
        9'b111110101: idcd_tmp = 8'b11110011;
        9'b111110110: idcd_tmp = 8'b11110100;
        9'b111110111: idcd_tmp = 8'b11110101;
        9'b111111000: idcd_tmp = 8'b11110110;
        9'b111111001: idcd_tmp = 8'b11110111;
        9'b111111100: idcd_tmp = 8'b11111000;
        9'b111111101: idcd_tmp = 8'b11111001;
        9'b111111110: idcd_tmp = 8'b11111010;
        9'b111111111: idcd_tmp = 8'b11111011;
     endcase
   end
endmodule
```

Figure 5:
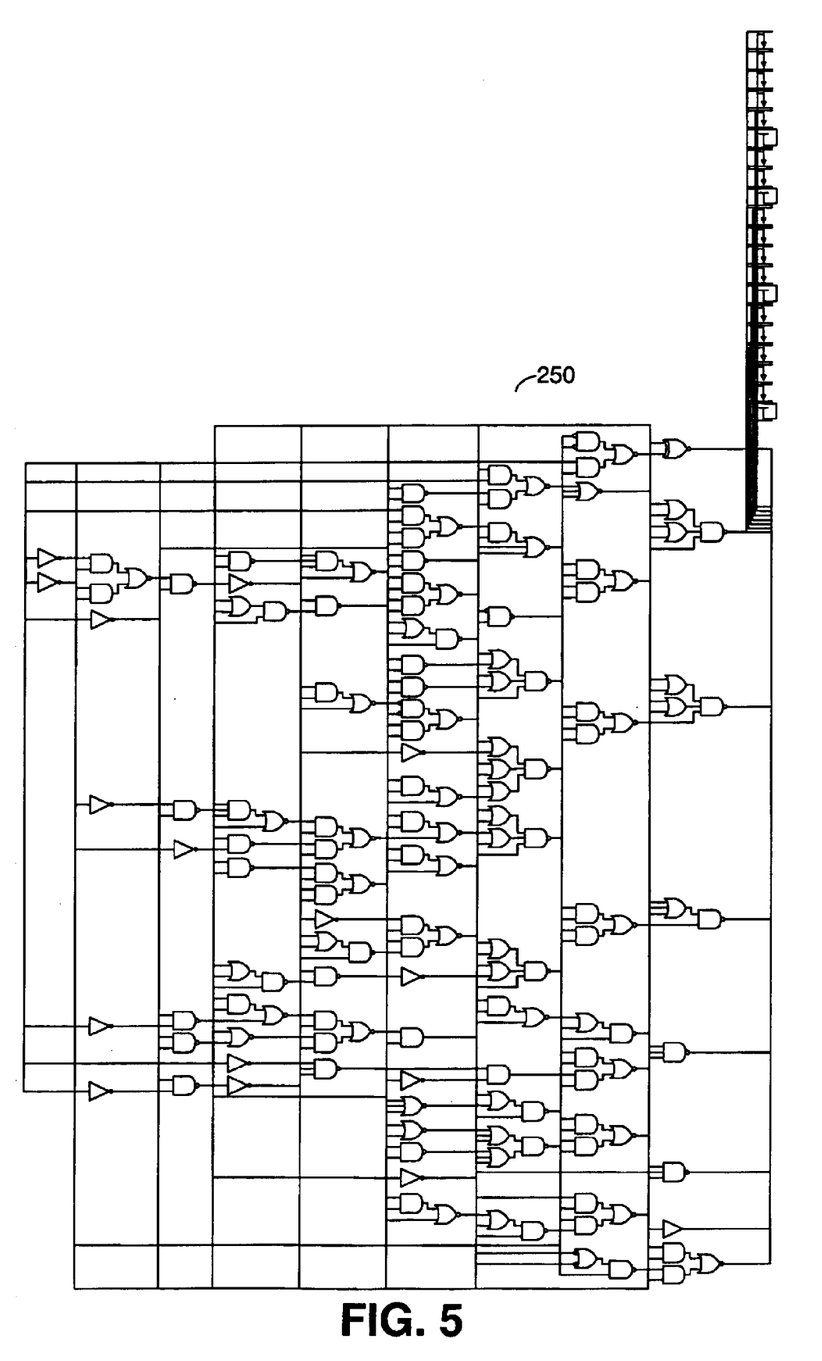
FIG. 5 is a logic diagram illustrating a logic circuit of FIG. 4.

Referring to FIG. 5, a logic diagram of a circuit 250 illustrating an implementation of the Verilog code using the Synopsis Design Compiler is shown. The circuit 250 may be configured to logically combine the metal optioned bits, the bond optioned bits, and pin inputs to generate an ID code.

Figure 6:
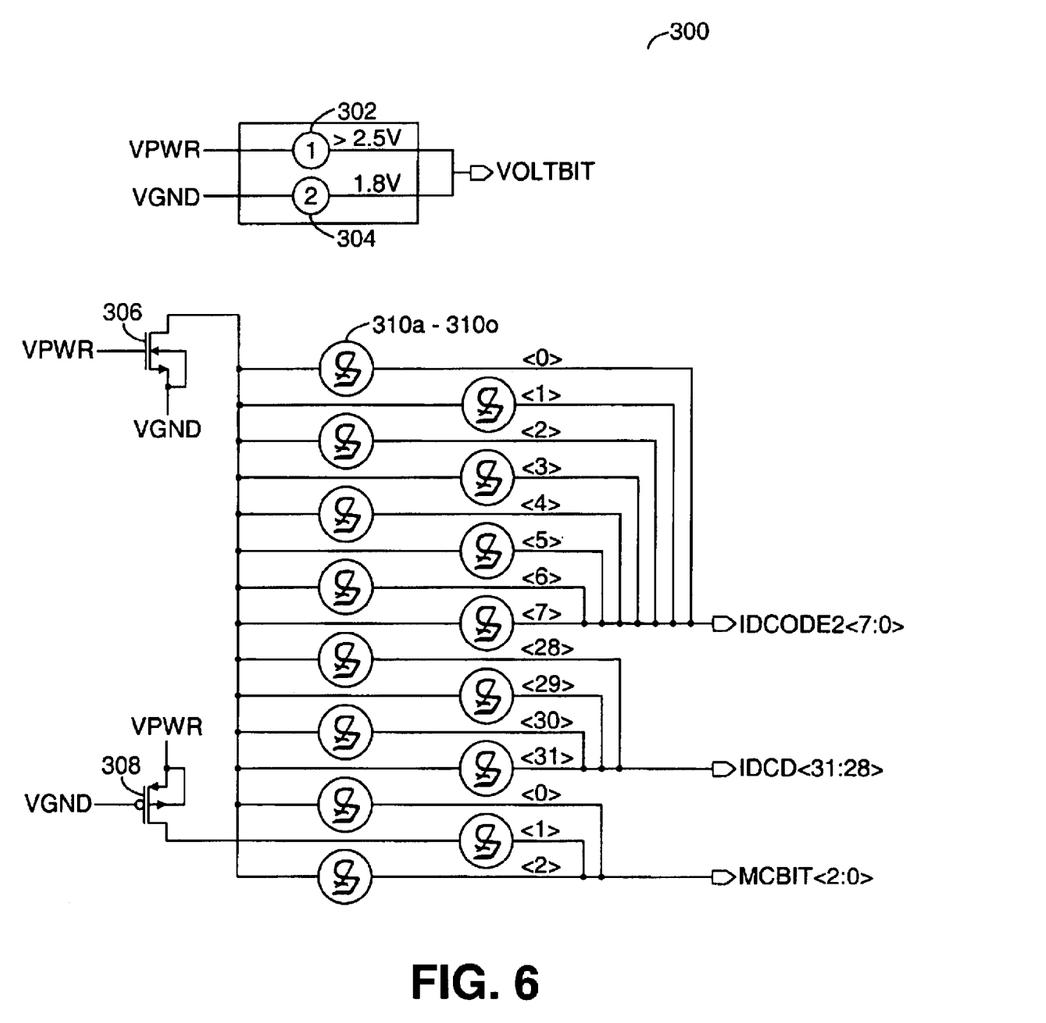
FIG. 6 is a schematic diagram illustrating an example of hard encoded information.

Referring to FIG. 6, a schematic diagram of a circuit 300 illustrating the use of metal options to program a number of the bits of the ID code is shown. For example, the signal VOLTBIT may be generated in response to either the signal VPWR or the signal VGND based on a metal option 302 or a metal option 304, respectively. The signals VPWR and VGND may be used to set the particular states of the bits of the signals MCBIT, IDCD<31:28> (e.g., the most significant bits of the register 100), and other signals (e.g., IDCODE2<7:0>). The signal VPWR may be presented to a gate of a transistor 306 and a source of a transistor 308. The signal VGND may be presented to a source of the transistor 306 and a gate of the transistor 308. A drain of the transistor 306 may be used to hard code a first state (e.g., "0") for the bits of the signals MCBIT, IDCD<31:28>, and IDCODE2<7:0>. A drain of the transistor 308 may be used to hard code a second state (e.g., "1") for the bits of the signals MCBIT, IDCD<31:28>, and IDCODE2<7:0>. The hard coding may be implemented using metal options, fuses, anti-fuses, or any other appropriate hard coding technique (e.g., hard coding structures 310*a*–*o*). The transistor 306 may be implemented, in one example, as one or more NMOS transistors. The transistor 308 may be implemented, in one example, as one or more PMOS transistors. However, other types of transistors may be implemented to meet the design criteria of a particular application.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a logic circuit comprising (i) one or more first inputs each connected to a respective one of one or more pins, (ii) one or more second inputs each connected to a respective one of one or more bond options, (iii) one or more third inputs each connected to a respective one of one or more metal options and (iv) an output configured to present a plurality of identification codes, wherein said logic circuit is configured to generate said plurality of identification (ID) codes in response to a logical combination of (i) one or more voltage levels on said one or more pins, (ii) a state of said one or more bond options and (iii) a state of said one or more metal options; and
    a package comprising said one or more pins, wherein said one or more pins are dedicated to providing said one or more voltage levels to respective ones of said one or more first inputs.

2. The apparatus according to claim 1, wherein said ID codes comprise a silicon ID of an electronic part.

3. The apparatus according to claim 1, wherein said logic circuit comprises a plurality of logic gates configured to logically combine said (i) one or more voltage levels on said one or more pins connected to said one or more first inputs, (ii) a state of said one or more bond options connected to said one or more second inputs and (iii) a state of said one or more metal options connected to said one or more third inputs to generate said plurality of ID codes having a number of bits less than a total number of said metal options, said bond options, and said pins.

4. The apparatus according to claim 1, wherein said one or more pins are connectable to either a voltage supply power or a voltage supply ground according to markings on said package.

5. The apparatus according to claim 1, wherein each of said plurality of ID codes comprises a part number for said apparatus.

6. The apparatus according to claim 5, wherein said part number is combined with other identification codes.

7. The apparatus according to claim 6, wherein said other ID codes comprise one or more codes selected from the group consisting of a version number and a manufacturing number.

8. The apparatus according to claim 1, further comprising a register configured to capture said ID codes from said output of said logic circuit in response to an identification request.

9. The apparatus according to claim 8, wherein said register comprises a JTAG ID code register.

10. The apparatus according to claim 1, wherein said apparatus comprises a programmable logic device (PLD).

11. The apparatus according to claim 1, wherein said metal options are set to indicate an operating voltage of said apparatus.

12. The apparatus according to claim 1, wherein said bond options are set based on a style of said package of said apparatus.

13. The apparatus according to claim 1, wherein said one or more pins are labeled as either a first or a second supply voltage.

14. The apparatus according to claim 13, wherein said one or more pins are labeled as either said first or said second supply voltage based on characteristics of said apparatus.

15. The apparatus according to claim 14, wherein said characteristics comprise one or more characteristics selected from the group consisting of volatility, price, package, metal options, operating voltage, internal structure, part category and density.

16. A method of providing a plurality of identification codes for a single die and package combination comprising the steps of:
    (A) dedicating (i) one or more pins of said package, (ii) one or more bond options and (iii) one or more metal options to generating a plurality of identification codes;
    (B) generating said plurality of identification codes in response to a logical combination of (i) voltage levels on said one or more pins, (ii) a state of said one or more bond options and (iii) a state of said one or more metal options; and
    (C) providing an indication of said voltage levels to be applied to each of said one or more pins.

17. The method according to claim 16, wherein the step (B) further comprises of steps of:
    determining said voltage levels on said one or more pins;
    determining said state of said one or more detail options;
    determining said state of said one or more bond options; and
    logically combining a result of each determining step.

18. The method according to claim 16, further comprising the steps of:
    presenting a generated identification code in response to an identification request.

19. The method according to claim 18, wherein said identification request comprises a JTAG ID code instruction.

20. An apparatus comprising:
    means for generating a plurality of identification codes in response to a logical combination of (i) one or more voltage levels asserted at one or more pins connected to one or more first inputs, (ii) a state of one or more bond options connected to one or more second inputs and (iii) a state of one or more metal options connected to one or more third inputs; and
    means for packaging said generating means comprising said one or more pins dedicated to providing said one or more voltage levels to respective ones of said one or more first inputs.

21. The apparatus according to claim 1, wherein said apparatus can present more than one of said plurality of identification codes after packaging.

22. The apparatus according to claim 1, wherein said apparatus changes identification code in response to a change in said one or more voltage levels applied to said one or more pins.

23. The apparatus according to claim 1, wherein said package further comprises one or more pins dedicated to a test access port, at least one voltage supply pin and at least one ground pin.

24. The method according to claim 16, further comprising:
marking voltage level indications on said package after assembly to select a particular one of said plurality of identification codes for said die and package combination.

25. The method according to claim 16, further comprising:
changing voltage level indications provided to select different identification codes.

26. The apparatus according to claim 1, wherein:
each of said one or more metal options is configured to couple said respective one of said one or more third inputs to one of a pull-up device and a pull-down device.

* * * * *